(12) United States Patent
Kawanabe et al.

(10) Patent No.: US 12,238,827 B2
(45) Date of Patent: Feb. 25, 2025

(54) BASE STRUCTURE AND WAFER PLACING DEVICE

(71) Applicant: KYOCERA Corporation, Kyoto (JP)

(72) Inventors: Yasunori Kawanabe, Kirishima (JP);
Yuusaku Ishimine, Aira (JP);
Yoshihiro Okawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 730 days.

(21) Appl. No.: 17/598,798

(22) PCT Filed: Mar. 13, 2020

(86) PCT No.: PCT/JP2020/011043
§ 371 (c)(1),
(2) Date: Sep. 27, 2021

(87) PCT Pub. No.: WO2020/195930
PCT Pub. Date: Oct. 1, 2020

(65) Prior Publication Data
US 2022/0201804 A1    Jun. 23, 2022

(30) Foreign Application Priority Data

Mar. 28, 2019 (JP) ................... 2019-063621

(51) Int. Cl.
*H05B 3/28* (2006.01)
*H05B 1/02* (2006.01)
*H01L 21/683* (2006.01)

(52) U.S. Cl.
CPC ............. *H05B 3/28* (2013.01); *H05B 1/0233* (2013.01); *H01L 21/683* (2013.01); *H05B 2203/016* (2013.01)

(58) Field of Classification Search
CPC ............. H01L 21/67103; H01L 21/683; H01L 21/6831; H01L 21/68757; H01L 21/68785;
(Continued)

(56) References Cited

U.S. PATENT DOCUMENTS 5,133,120 A * 7/1992 Kawakami ........... H05K 3/4053
228/33
6,303,879 B1 * 10/2001 Burkhart ........... H01L 23/49827
174/262
(Continued)

FOREIGN PATENT DOCUMENTS

| JP | 2013-084938 A | 5/2013 |
|---|---|---|
| JP | 2017-135250 A | 8/2017 |
| KR | 10-1416152 B1 | 2/2014 |

*Primary Examiner* — Sang Y Paik
(74) *Attorney, Agent, or Firm* — Procopio, Cory, Hargreaves & Savitch LLP

(57) ABSTRACT

A base structure includes a base, a first conductor layer, and a via conductor. The base has a first surface. The first conductor layer is positioned along the first surface in the base. The via conductor includes a first part and a second part in a section that includes the via conductor and that extends in a first direction perpendicular to the first surface. The length of the first part in the first direction is larger than the thickness of the first conductor layer. The length of the second part in the first direction is larger than the thickness of the first conductor layer. The second part is continuous with the first part, and at least a portion of the outer edge of the second part is displaced from the outer edge of the first part when viewed in the first direction.

11 Claims, 9 Drawing Sheets

(58) Field of Classification Search
CPC .. H05B 1/0233; H05B 2203/016; H05B 3/28; H05B 3/283
USPC .............................. 219/444.1, 541, 546–548
See application file for complete search history.

(56) References Cited

U.S. PATENT DOCUMENTS

| | | | |
|---|---|---|---|
| 2003/0104186 A1* | 6/2003 | Ito ..................... | H01L 23/49827 428/209 |
| 2004/0071945 A1* | 4/2004 | Ito ...................... | H01L 21/6831 428/209 |
| 2009/0176065 A1* | 7/2009 | Takebayashi ....... | H01L 21/6833 428/173 |
| 2014/0355170 A1 | 12/2014 | Wada et al. | |

* cited by examiner

FIG. 5
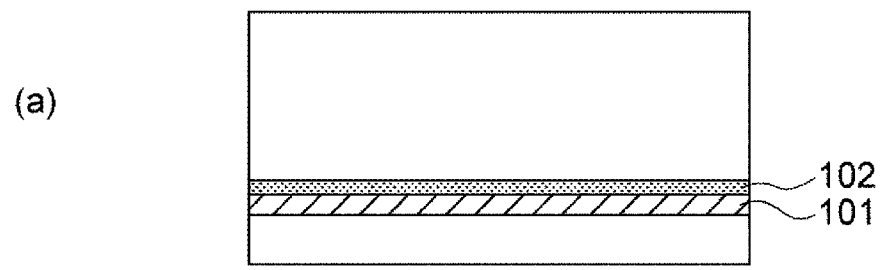
(a)
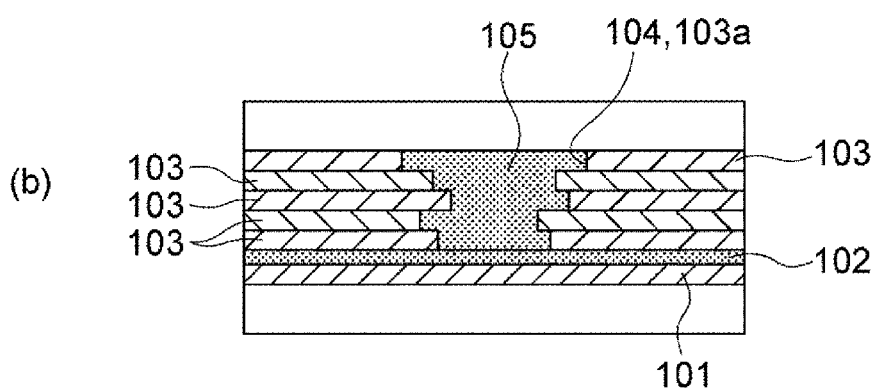
(b)
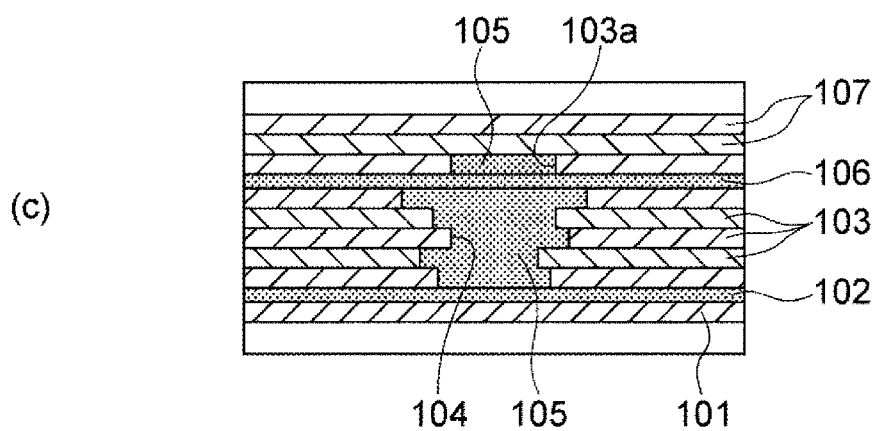
(c)
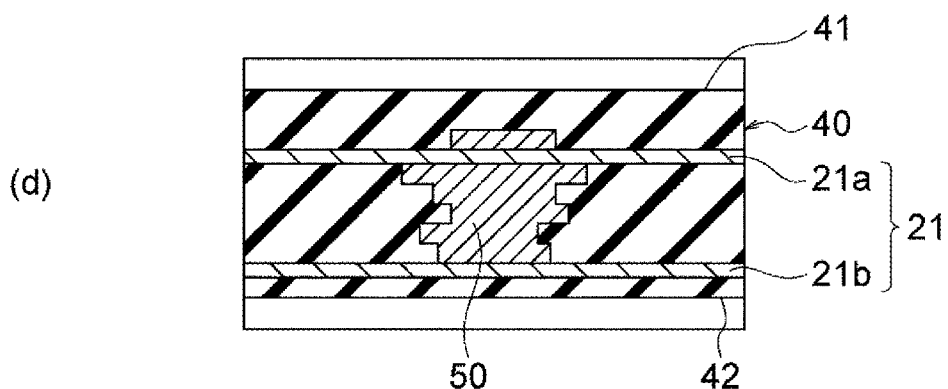
(d)

BASE STRUCTURE AND WAFER PLACING DEVICE

TECHNICAL FIELD

The present disclosure relates to a base structure that includes a via conductor, and a wafer placing device that includes the base structure.

BACKGROUND ART

For example, there is a known base structure that places an object, such as a wafer, in a semiconductor manufacturing apparatus that manufactures a semiconductor. For example, a heater is presented as a base structure (refer to PTL 1).

CITATION LIST

Patent Literature

PTL 1: Japanese Unexamined Patent Application Publication No. 2017-135250

SUMMARY OF INVENTION

A base structure according to one aspect of the present disclosure includes a base, a first conductor layer, and a via conductor. The base has a first surface and a second surface that is positioned opposite to the first surface. The first conductor layer is positioned along the first surface in the base. The via conductor intersects and is coupled to the first conductor layer in the base. The via conductor includes a first part and a second part in a section that includes the via conductor and that extends in a first direction perpendicular to the first surface. The length of the first part in the first direction is larger than the thickness of the first conductor layer. The length of the second part in the first direction is larger than the thickness of the first conductor layer. The second part is continuous with the first part, and at least a portion of the outer edge of the second part is displaced from the outer edge of the first part when viewed in the first direction.

A wafer placing device according to one aspect of the present disclosure includes the aforementioned base structure, a power supply unit that is capable of supplying electric power to the first conductor layer, and a control unit that controls power supply of the power supply unit.

BRIEF DESCRIPTION OF DRAWINGS

FIG. 5(a), FIG. 5(b), FIG. 5(c), and FIG. 5(d) are sectional views illustrating a method of manufacturing the conductor layer and the via conductor illustrated in FIG. 3.

DESCRIPTION OF EMBODIMENTS

Figure 1:
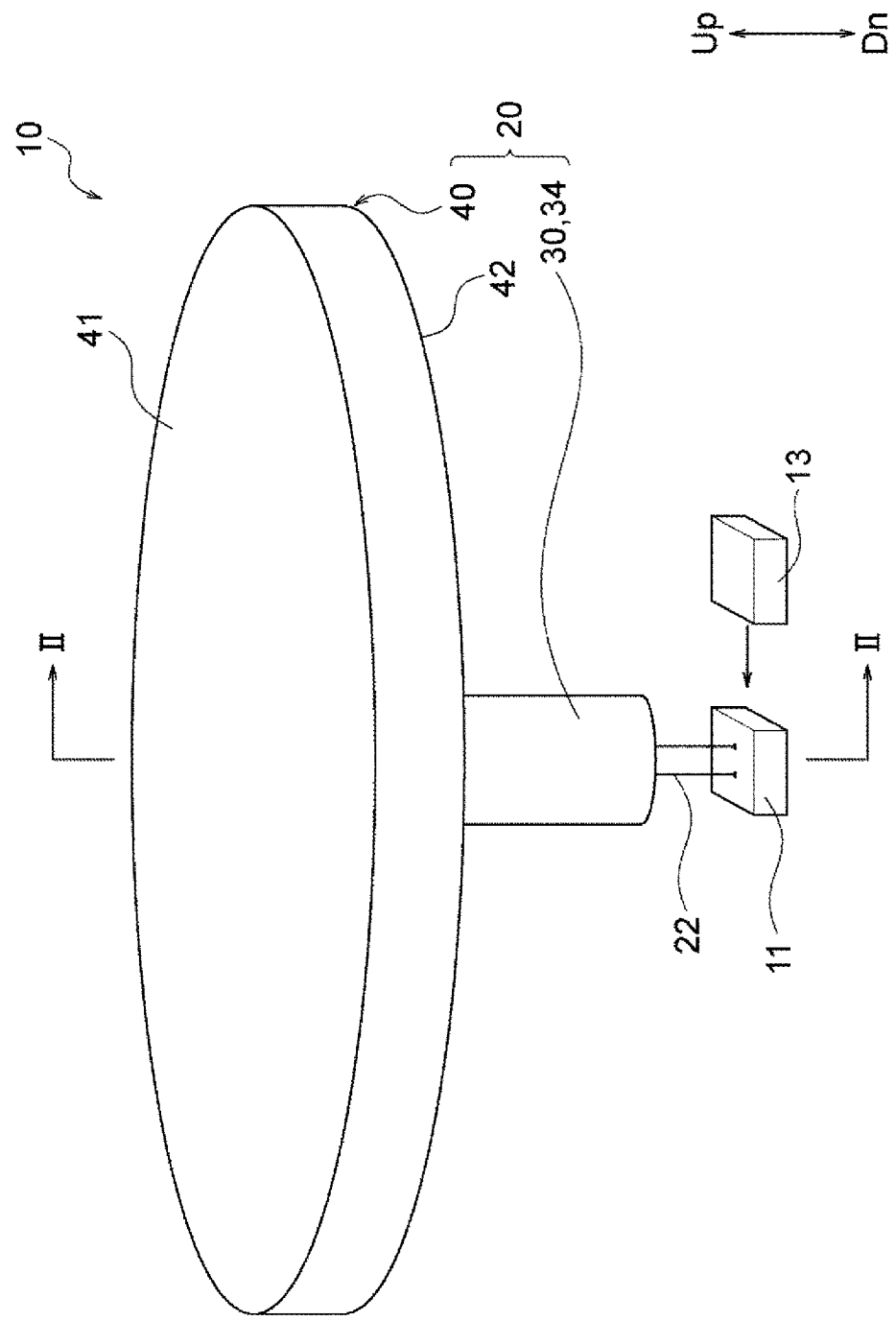
FIG. 1 is a schematic perspective view of a wafer placing device according to a first embodiment.

Embodiments of the present disclosure will be described with reference to the attached drawings. In the description, up and down denote up and down based on a state in which a wafer is placed on a base structure. In the drawings, Up indicates up, and Dn indicates down. The drawings to be referred are schematically illustrated, and details may be omitted.

To describe the present disclosure, expressions that indicate directions, such as an upper end and a lower end, are used in some places. These expressions are used for convenience in relation to the drawings. Thus, an upper end is not limited to an end portion on the upper side, and a lower end is not limited to an end portion on the lower side. In the following description, an upper end can be read as one end (an end portion on one side), and a lower end can be read as the other end (an end portion on the other side). The same applies to expressions that indicate the up and down directions, such as an upper surface and a lower surface.

First Embodiment

FIG. 1 will be referred. A wafer placing device 10 includes a base structure 20 on which an object (for example, a wafer) is to be placed, a power supply unit 11 that supplies electric power to the base structure 20, and a control unit 13 that controls supply of electric power of the power supply unit 11.

(Base Structure)

Figure 2:
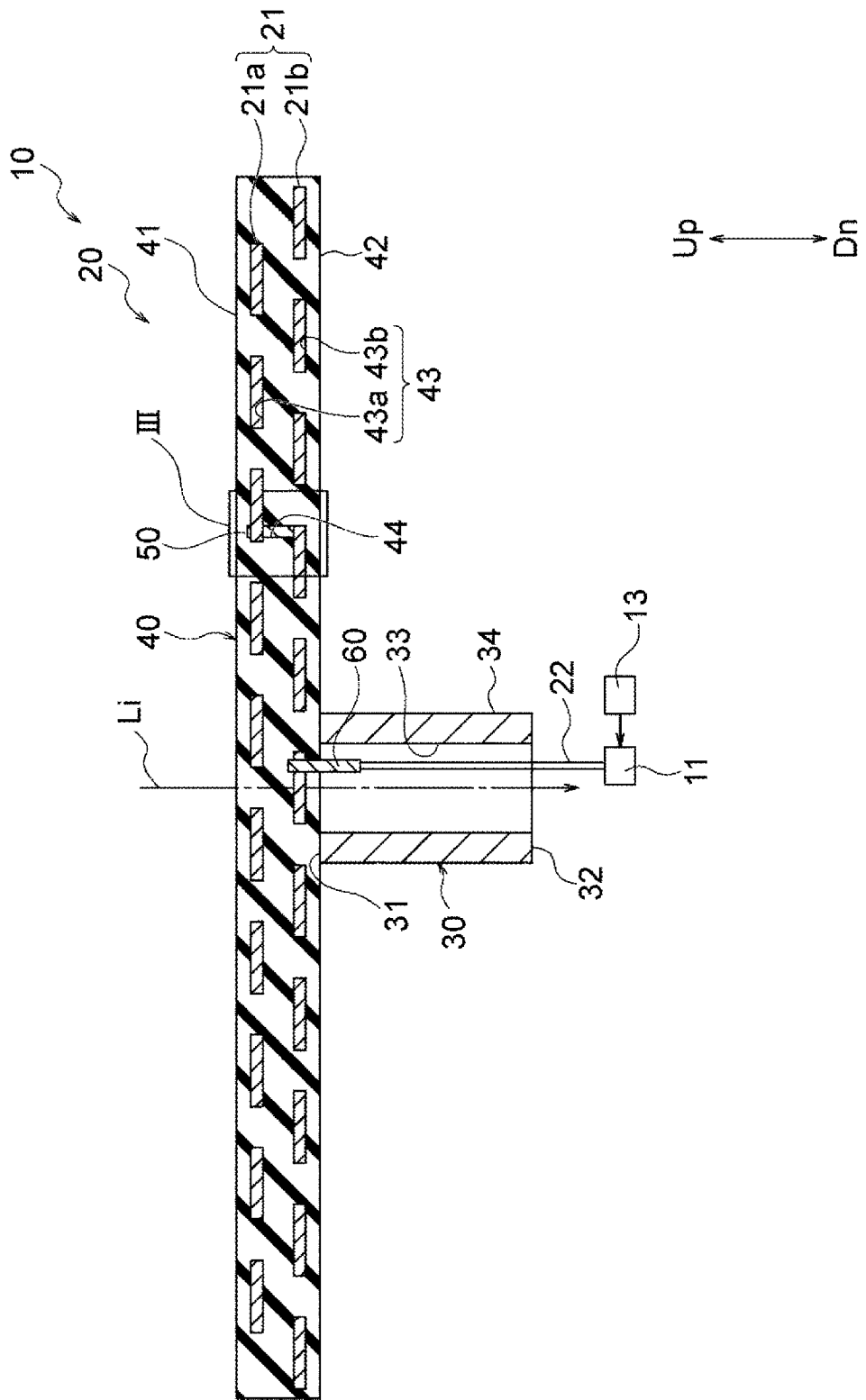
FIG. 2 is a sectional view along line II-II of the wafer placing device illustrated in FIG. 1.

FIG. 2 will be referred. The base structure 20 includes a cylindrical shaft member 30, a base 40 that is fixed to the upper end of the shaft member 30 and that has a surface 41 on which a wafer is to be placed, a conductor layer 21 positioned in the base 40, a via conductor 50 connected to the conductor layer 21, a terminal 60 including a portion that is positioned in the base 40 and that is connected to the conductor layer 21, and a connection portion 22 connected to the terminal 60.

The conductor layer 21 constituting the base structure 20 includes a first conductor layer 21a and a second conductor layer 21b. In relation to the second conductor layer 21b, the first conductor layer 21a is relatively positioned on the side of the surface 41 (the first surface 41, which will be described later) on which a wafer is to be placed. In relation to the first conductor layer 21a, the second conductor layer 21b is relatively positioned on the side of a surface 42 (the second surface 42, which will be described later) opposite to the surface 41 on which a wafer is to be placed. As one form, the first conductor layer 21a and the second conductor layer 21b extend along the surface 41, on which a wafer is to be placed, and are provided in an entire region in the base 40. The first conductor layer 21a and the second conductor layer 21b have been described simply in this paragraph since there are places in which the present disclosure is described on the basis of the first conductor layer 21a and the second conductor layer 21b. Hereinafter, components of the base structure 20 will be described sequentially.

(Shaft Member)

The shaft member 30 has a cylindrical shape, and the upper end thereof is joined to the lower surface of the base 40. As one form, the shaft member 30 is joined (bonded) to the base 40 by an adhesive material. As another form, the shaft member 30 is joined to the base 40 by solid phase bonding. The shape of the shaft member 30 can be any shape. As one form, the shape of the shaft member 30 is a cylindrical shape. As another form, the shape of the shaft member 30 is, for example, a shape of a rectangular pipe or the like. The material of the shaft member 30 can be any material. As one form, the material of the shaft member 30 is insulating ceramic. As another form, the material of the shaft member 30 is, for example, a conductive material (metal).

The cylindrical shaft member 30 includes an upper surface portion 31 joined to the lower surface of the base 40, a lower surface portion 32 positioned opposite to the upper surface portion 31, an inner surface portion 33 that couples the upper surface portion 31 and the lower surface portion 32 and that constitutes the inner side of the shaft member 30, and an outer surface portion 34 that couples the upper surface portion 31 and the lower surface portion 32 and that constitutes the outer side of the shaft member 30.

In the illustrated example, the inner surface portion 33 is provided parallel to the outer surface portion 34 in a direction in which the shaft member 30 extends. From another point of view, the inner surface portion 33 is provided parallel to a straight line parallel to the thickness direction of the base 40. The inner surface portion 33 may be inclined such that the inner diameter of the shaft member 30 decreases toward the lower side and may be inclined such that the inner diameter of the shaft member 30 increases toward the lower side. The outer surface portion 34 can have the same configuration. Consequently, it is possible for the shaft member 30 to have the inner diameter and/or the outer diameter that is different over a portion from the upper end to the lower end.

(Base)

The base 40 is constituted by an insulating material such as ceramic. For example, the ceramic that constitutes the base 40 contains, as a main component, aluminum nitride (AlN), aluminum oxide ($Al_2O_3$, alumina), silicon carbide (SiC), silicon nitride ($Si_3N_4$), or the like. Here, the main component is, for example, a material that occupies more than or equal to 50 mass % or more than or equal to 80 mass % of the material.

In the illustrated example, the base 40 is a flat substrate having a thickness in the up-down direction. The shape of the base 40 can be any shape. The shape of the base 40 is a circular shape, an elliptical shape, a rectangular shape, a trapezoidal shape, or the like in a plan view. The size of the base 40 can be any size. As the dimensions of the base 40, for example, the diameter is more than or equal to 20 cm and less than or equal to 40 cm, and the thickness is more than or equal to 5 mm and less than or equal to 35 mm. The base 40 is not limited to having a flat shape and may have, for example, a rod shape.

Figure 3:
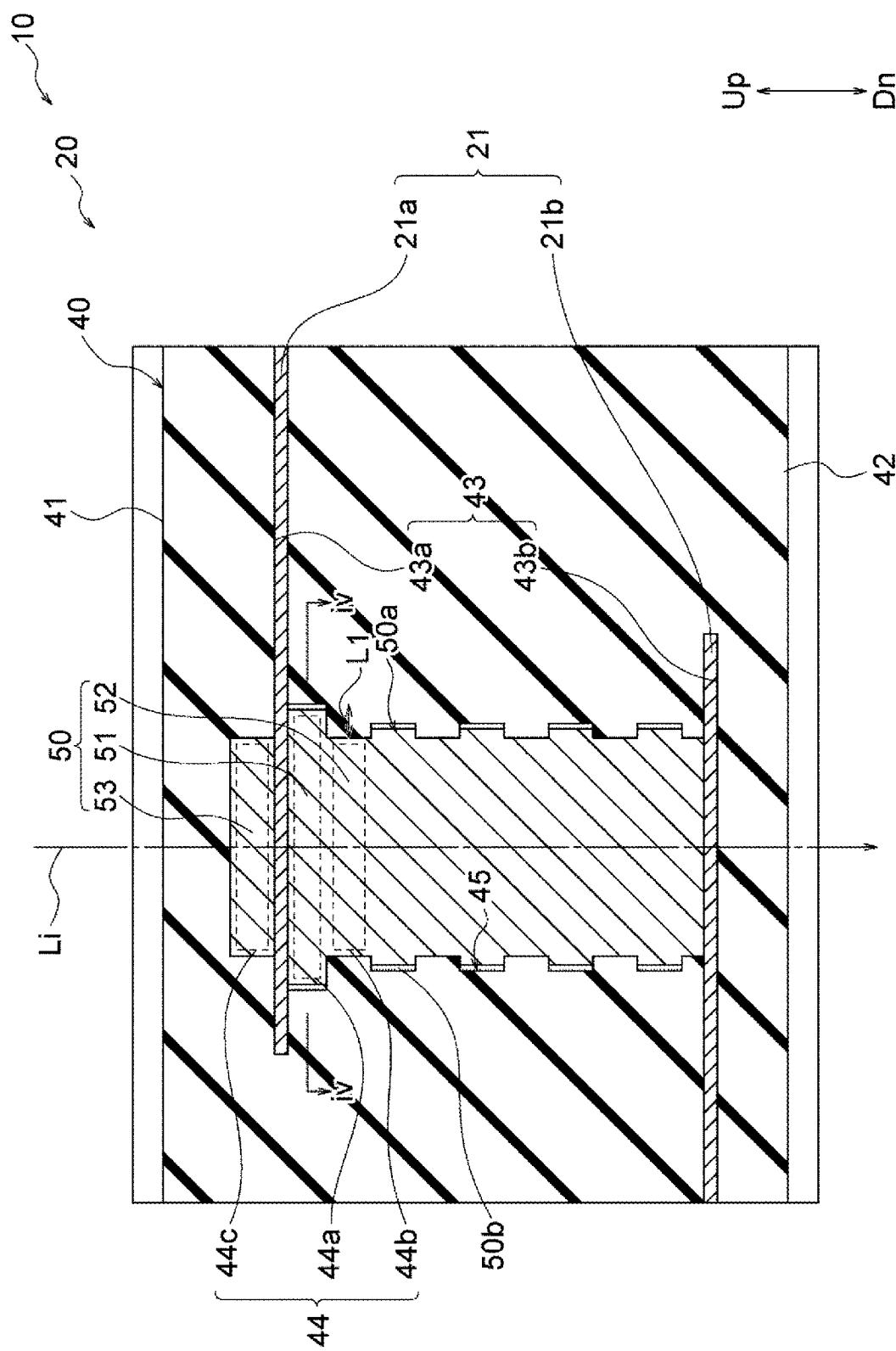
FIG. 3 is an enlarged view of the part III of a base structure illustrated in FIG. 2.

FIG. 2 and FIG. 3 will be referred. The base 40 includes the first surface 41 on which an object is to be placed, the second surface 42 positioned opposite to the first surface 41, an accommodation portion 43 that is provided in the base 40 and that accommodates the conductor layer 21, and a via hole 44 coupled to the accommodation portion 43. The first surface 41 constitutes the upper surface of the base 40, and the second surface 42 constitutes the lower surface of the base 40. The first surface 41 and the second surface 42 are parallel to each other.

The accommodation portion 43 includes a first accommodation portion 43a positioned on the side of the first surface 41, and a second accommodation portion 43b facing the first accommodation portion 43a and positioned on the side of the second surface 42.

The first conductor layer 21a is positioned in the first accommodation portion 43a. The second conductor layer 21b is positioned in the second accommodation portion 43b. The first accommodation portion 43a and the second accommodation portion 43b are each positioned along the first surface 41 in the base 40. The first accommodation portion 43a and the second accommodation portion 43b each extend over the entire region of the base 40. When a direction perpendicular to the first surface 41 is defined as a first direction Li, (hereinafter, the expression "first direction Li" will be used in some places), the length (hereinafter referred to as "height" in this paragraph) of each of the first accommodation portion 43a and the second accommodation portion 43b in the first direction Li can be any length. The aforementioned heights of the first accommodation portion 43a and the second accommodation portion 43b are determined by, for example, the thicknesses of the first conductor layer 21a and the second conductor layer 21b. Thus, there are a case in which the height of the first accommodation portion 43a is higher than the height of the second accommodation portion 43b and a case in which the height of the second accommodation portion 43b is higher than the height of the first accommodation portion 43a. In addition, the height of each of the first accommodation portion 43a and the second accommodation portion 43b can be different depending on each part extending along the first surface 41. Consequently, the resistance values of the first conductor layer 21a and the second conductor layer 21b are different.

(Via Hole)

FIG. 3 will be referred. The via hole 44 extends in the first direction Li. From another point of view, the via hole 44 extends in the thickness direction of the base 40. In the example in FIG. 2, only one via hole 44 is illustrated. However, the base 40 may have a plurality of the via holes 44. The length (the length in the thickness direction of the base 40) of the via hole 44 is larger than the thickness of each of the first conductor layer 21a and the second conductor layer 21b. The length of the via hole 44 may be, for example, more than or equal to 10 mm, may be more than or equal to 4 mm, may be more than or equal to 2 mm, and may be more than or equal to 1 mm. The length of the via hole 44 may be shorter than 1 mm.

Figure 4:
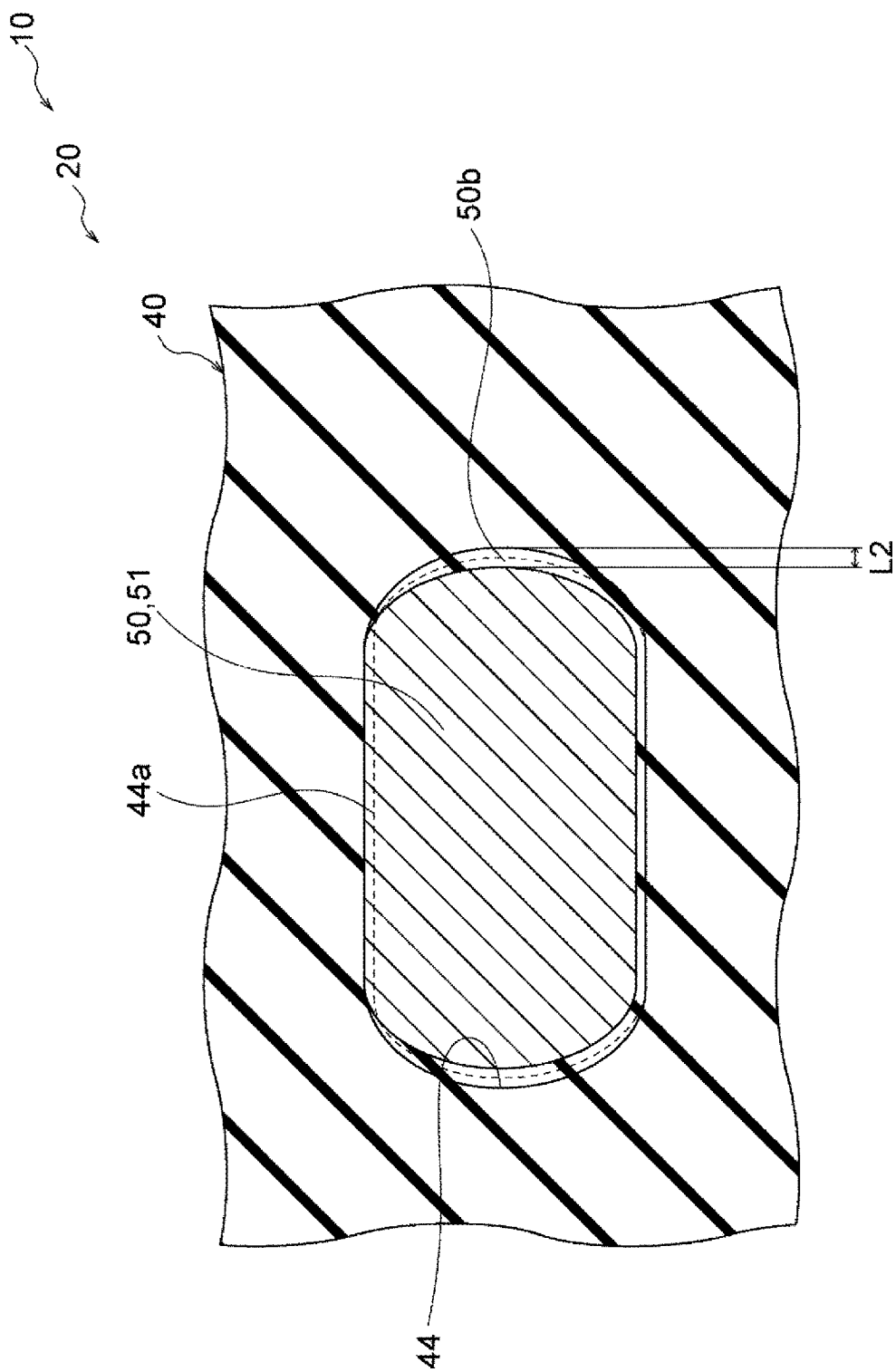
FIG. 4 is a sectional view along line iv-iv of a via conductor illustrated in FIG. 3.

FIG. 4 will be referred. The shape of the via hole 44 can be any shape. As one form, the shape of the via hole is an elliptical shape in see-through plan view. The size of the inner diameter of the via hole 44 in the longitudinal direction and/or the short direction can be any size. These sizes of the inner diameter may be, for example, more than or equal to 60 µm, may be more than or equal to 100 µm, may be more than or equal to 150 µm, may be more than or equal to 300 µm, and may be more than or equal to 1 mm. The inner diameter of the via hole 44 may be smaller than 60 µm. As another form, in see-through plan view, the shape of the via hole 44 may be, for example, a circular shape and may be a polygonal shape, such as a rectangular shape. The size of the inner diameter of the via hole 44 that has a circular shape or a rectangular shape also can be any size, as described above.

FIG. 3 will be referred. The via hole 44 includes recesses and protrusions 45 at a vertical section (first direction Li) intersecting the first conductor layer 21a. The via hole 44 has a first region 44a that is adjacent to the first conductor layer 21a and that is positioned on the side of the second conductor layer 21b, a second region 44b that is continuous with the first region 44a and that is positioned on the side of the second conductor layer 21b from the first region 44a, and a third region 44c that faces the first region 44a with the first conductor layer 21a interposed between the third region 44c and the first region 44a.

The first region 44a is one region constituted by the recesses and protrusions 45 of the via hole 44. The second region 44b is one region constituted by the recesses and protrusions 45 of the via hole 44 and is a region positioned on the lower side of the first region 44a. At least a portion of the inner wall (the surface of the via hole 44 in a direction parallel to the first surface 41) of the via hole 44 in the first region 44a is displaced from the inner wall of the via hole 44 in the second region 44b when viewed in the first direction Li.

The "displaced" means that the inner wall of the via hole 44 in the first region 44a and the inner wall of the via hole 44 in the second region 44b do not coincide with each other in a direction along the first surface 41. As one example, there is a form in which the inner diameter of the via hole 44 in the first region 44a and the inner diameter of the via hole 44 in the second region 44b differ from each other and in which the inner wall of the via hole 44 in the first region 44a and the inner wall of the via hole 44 in the second region 44b are displaced from each other. As one example, there is a form in which the center of the second region 44b is displaced from the center of the first region 44a and in which the inner walls of the via hole 44 are thus displaced from each other. As one example, there is a combination of the aforementioned two forms. From another point of view, displacement may be generated in the entirety of the via hole 44 in the circumferential direction and may be generated in only a portion thereof in the circumferential direction. A length (from another point of view, the angle range around the center of the via hole 44 in plan view) in the circumferential direction in which displacement is generated may be set, as appropriate. For example, the total of angle ranges in which displacement is generated may be more than or equal to 180° and may be less than 180°.

The inner diameter of the via hole 44 in the first region 44a is larger than the inner diameter of the via hole 44 in the second region 44b. In other words, the first region 44a is larger than the second region 44b in the direction parallel to the first surface 41. When the first region 44a and/or the second region 44b has an elliptical shape or the like, the inner diameter of the via hole 44 in the first region 44a is larger than the inner diameter of the via hole 44 in the second region 44b in each of the longitudinal direction and the short direction of the elliptical shape. The size of the first region 44a relative to the second region 44b can be any size. For example, the size of the first region 44a in the radial direction of the via hole 44 may be more than or equal to 1.1 times, more than or equal to 1.3 times, more than or equal to 1.5 times, or more than or equal to 1.7 times the size of the second region 44b. The size of the first region 44a may be less than 1.1 times the size of the second region 44b. The thickness (the thickness in the first direction Li) of each of the first region 44a and the second region 44b is thicker than the thickness of each of the first conductor layer 21a and the second conductor layer 21b.

The third region 44c is one region constituted by the recesses and protrusions 45 of the via hole 44 and is positioned away from the second conductor layer 21b more than the first region 44a.

As illustrated in the drawings, a plurality of regions constituted by the recesses and protrusions 45 of the via hole 44 are provided between the second region 44b and the second conductor layer 21b. The length of each of the plurality of regions in the first direction Li is larger than the thickness of each of the first conductor layer 21a and the second conductor layer 21b. The inner diameter of the via hole 44 in the plurality of regions is smaller than the inner diameter of the via hole 44 in the first region 44a.

(Conductor Layer)

FIG. 2 will be referred. The conductor layer 21 includes the first conductor layer 21a that is positioned on the side of the first surface 41 in the base 40, and the second conductor layer 21b that faces the first conductor layer 21a and that is positioned on the side of the second surface 42 in the base 40. The first conductor layer 21a and the second conductor layer 21b extend along the first surface 41. The second conductor layer 21b faces the first conductor layer 21a.

The first conductor layer 21a includes a resistive heating element that generates heat in response to electric power from the power supply unit 11. The second conductor layer 21b also includes a resistive heating element that generates heat in response to electric power from the power supply unit 11. The heat generated by these resistive heating elements heats a wafer placed on the first surface 41. Thus, it can be said that the base structure 20 is a heater. The first conductor layer 21a and/or the second conductor layer 21b is constituted by, for example, a coil, a layer-shaped conductor, or the like.

The first conductor layer 21a and/or the second conductor layer 21b has, for example, a helical shape or a meandering shape in see-through plan view of the base 40. The first conductor layer 21a and the second conductor layer 21b each extend along the first surface 41 over the entire region of the base 40. From another point of view, the first conductor layer 21a and the second conductor layer 21b extend perpendicularly to the thickness direction of the base 40 and spread over the entire region of the base 40. Consequently, the temperature of the entirety of the first surface 41 can be increased efficiently. In FIG. 2, the conductor layer 21 is illustrated in a section (a section in the width direction of the conductor layer 21) orthogonal to a direction in which the conductor layer 21 extends. The conductor layer 21 is, for example, a metal constituted by Ni, W, Mo, Pt, or the like, or an alloy that contains at least some of these metals.

(Via Conductor)

FIG. 3 will be referred. The via conductor 50 is a conductor with which the via hole 44 is filled. The via conductor 50 extends in the first direction Li and connects the first conductor layer 21a and the second conductor layer 21b such that electric power can pass therebetween. The via conductor 50 is constituted by, for example, a metal, such as Ni, W, Mo, Pt, or the like, or an alloy that contains at least some of these metals. The diameter (for example, the maximum diameter) of the via conductor 50 is, for example, smaller than each of the width of the first conductor layer 21a and the width of the second conductor layer 21b. Differently from the illustrated example, the diameter of the via conductor 50 may be larger than each of the width of the first conductor layer 21a and the width of the second conductor layer 21b in a portion or the entirety thereof in the up-down direction and/or in a specific direction parallel to the first surface 41 or in all directions.

The via conductor 50 includes a first part 51 positioned in the first region 44a, a second part 52 positioned in the second region 44b, and a third part 53 positioned in the third region 44c. The first part 51 and the second part 52 are positioned between the first conductor layer 21a and the second conductor layer 21b.

The first part 51 is coupled to the lower surface of the first conductor layer 21a and extends in the first direction Li. As previously described, the first direction Li is a direction perpendicular to the first surface 41. The first part 51 may extend by an amount smaller than the diameter of the first part 51 and may extend by an amount larger than the diameter of the first part 51 in the first direction Li. The length of the first part 51 in the first direction Li is larger than the thickness of the first conductor layer 21*a*. The diameter (from another point of view, the area in a section parallel to the first surface 41; hereinafter, the same applies to the other diameters as long as contradiction and the like are not generated) of the first part 51 is larger than the diameter of the second part 52. More specifically, the first part 51 has the largest diameter in the entirety of the via conductor 50. The size of the diameter of the first part 51 relative to the diameter of the second part 52 can be any size. For example, the size of the diameter of the first part 51 may be more than or equal to 1.1 times, more than or equal to 1.3 times, more than or equal to 1.5 times, or more than or equal to 1.7 times the diameter of the second part 52. The size of the diameter of the first part 51 may be less than 1.1 times the diameter of the second part 52. The material of the first part 51 (the via conductor 50) may be the same as the material of the first conductor layer 21*a* and, in this case, may be integral with the first conductor layer 21*a*.

The second part 52 is positioned on the lower side of the first part 51 and is coupled to the first part 51. From another point of view, the second part 52 is coupled to the first part 51 on a side opposite the first conductor layer 21*a*. The second part 52 extends from the lower surface of the first part 51 in the first direction Li. The length of the second part 52 in the first direction Li is larger than the thickness of each of the first conductor layer 21*a* and the second conductor layer 21*b*. When the second part 52 is viewed in the first direction Li, at least a portion of the outer edge thereof is displaced from the outer edge of the first part 51.

The "displaced" means that the outer edge of the first part 51 and the outer edge of the second part 52 do not coincide with each other in the direction along the first surface 41. As one example, there is a form in which the size of the diameter of the first part 51 and the size of the diameter of the second part 52 differ from each other and in which the outer edges thereof are displaced from each other. As one example, there is a form in which the center of the first part 51 is displaced from the center of the second part 52 and in which the outer edges thereof are thus displaced (shifted) from each other. From another point of view, displacement may be generated in the entirety of the via conductor 50 in the circumferential direction and may be generated in only a portion thereof in the circumferential direction. A length (from another point of view, an angle range around the center of the via conductor 50 in plan view) in the circumferential direction in which displacement is generated may be set, as appropriate. For example, the total of angle ranges in which displacement is generated may be more than or equal to 180° and may be less than 180°.

The third part 53 faces the first part 51 with the first conductor layer 21*a* interposed between the third part 53 and the first part 51. The third part 53 is positioned on the upper side of the first conductor layer 21*a* and is coupled to the first conductor layer 21*a*. The third part 53 extends in the first direction Li from the upper surface of the first conductor layer 21*a* in a direction away from the first part 51. The length of the third part 53 in the first direction Li is larger than the thickness of each of the first conductor layer 21*a* and the second conductor layer 21*b*. The material of the third part 53 (the via conductor 50) may be the same as the material of the first conductor layer 21*a* and, in this case, may be integral with the first conductor layer 21*a*.

FIG. 3 and FIG. 4 will be referred. A cavity 50*b* is present between the inner wall (the base 40) of the via hole 44 and the via conductor 50. For example, the cavity 50*b* is a vacuum or encloses an appropriate gas. The same applies to the other cavities, which will be described later. The cavity 50*b* may be present over the entirety in the circumferential direction of the via conductor 50 and may be positioned at only a portion. In the latter case, the total of angle ranges of the cavity 50*b* around the center of the via conductor 50 may be more than or equal to 180° and may be less than 180°. Description of the cavity 50*b* may be applied, as appropriate, to the other cavities, which will be described later.

In the direction parallel to the first surface 41, the size of the cavity 50*b* is smaller than the amount of displacement (a value from the outer edge of the first part 51 to the outer edge of the second part 52 in the direction parallel to the first surface 41) between the outer edge of the first part 51 and the outer edge of the second part 52. When the amount of displacement between the outer edge of the first part 51 and the outer edge of the second part 52 is represented by L1 and the size of the cavity 50*b* is represented by L2, L1>L2 is established.

The amount of displacement may be different depending on a position at the boundary (circumferential direction) between the first part 51 and the second part 52. The aforementioned situation in which the amount of displacement is larger than the size of the cavity 50*b* may be established in only a predetermined section such as that illustrated in FIG. 3 and may be established over a certain length or more in the circumferential direction. For the latter case, for example, regarding the angle range around the center of the via conductor 50, the total of angle ranges in which both of displacement and the cavity 50*b* are generated is considered as a reference angle range. The amount of displacement may be larger than the size of the cavity 50*b* in at least more than 50% of the aforementioned angle range. The percentage in which the amount of displacement is larger than the size of the cavity 50*b* can be set, as appropriate. In one form, the percentage in which the amount of displacement is larger than the size of the cavity 50*b* is more than or equal to 70%. In one form, the percentage in which the amount of displacement is larger than the size of the cavity 50*b* is more than or equal to 85%. In one form, the percentage in which the amount of displacement is larger than the size of the cavity 50*b* is more than or equal to 95%. In one form, the percentage in which the amount of displacement is larger than the size of the cavity 50*b* is more than or equal to 99%.

The via conductor 50 includes a plurality of recesses and protrusions 50*a* between the second part 52 and the second conductor layer 21*b*. The diameter of each part of these recesses and protrusions 50*a* is smaller than the diameter of the first part 51. As previously described, the first part 51 is a part of the via conductor 50 having the largest diameter. The length of each of the recesses and protrusions 50*a* in the first direction Li is larger than the thickness of each of the first conductor layer 21*a* and the second conductor layer 21*b*.

(Terminal)

FIG. 2 will be referred. The terminal 60 is a metal (a bulk material) having a certain length in the up-down direction. The upper end side of the terminal 60 is positioned in the base 40, and the lower end side thereof is positioned outside the base 40. In the illustrated example, the terminal 60 is electrically connected to the second conductor layer 21*b*. The terminal 60 is also electrically connected to the first conductor layer 21*a* via the via conductor 50. The shape of the terminal 60 can be any shape. In one form, the shape of the terminal 60 is a columnar shape. The terminal 60 is constituted by, for example, a metal such as Ni, W, Mo, Pt, or the like, or an alloy that contains at least some of these metals.

(Connection Portion)

The upper end of the connection portion 22 is connected to the terminal 60, and the lower end thereof is connected to the power supply unit 11. The connection portion 22 connects the power supply unit 11 and the terminal 60 such that electric power can pass therebetween. The connection portion 22 contains a conductive material.

(Power Supply Unit)

The power supply unit 11 is positioned outside the base 40 and supplies electric power to the conductor layer 21 (a resistive heating element) via the connection portion 22. The power supply unit 11 is electrically connected to the conductor layer 21 via the connection portion 22. The power supply unit 11 includes a power supply circuit that converts electric power supplied from a power source into electric power having an appropriate voltage and supplies the electric power to the conductor layer 21.

Next, a method of manufacturing the base 40 (the conductor layer 21 and the via conductor 50) will be described.

FIG. 5(*a*) will be referred. FIG. 5(*a*) is a view in which conductive first paste is printed on the upper surface of a prepared first ceramic green sheet. Conductive first paste 102 contains a metal such as Ni, W, Mo, Pt, or the like. As one form, the first paste 102 is printed on the upper surface of a first ceramic green sheet 101 by screen printing. As another form, the first paste 102 is positioned on the upper surface of the first ceramic green sheet 101 by a method such as CVD, vapor deposition, or sputtering. In the illustrated example, the first ceramic green sheet 101 is only one sheet. However, the first paste 102 may be positioned on the upper surfaces of a plurality of layered first ceramic green sheets 101.

FIG. 5(*b*) will be referred. FIG. 5(*b*) illustrates a step of layering a second ceramic green sheet on the upper side of the first ceramic green sheet such the first paste is interposed between the first ceramic green sheet and the second ceramic green sheet. A second ceramic green sheet 103 has a through hole 103*a* that passes through the second ceramic green sheet 103 in the up-down direction. A plurality of the second ceramic green sheets 103 are prepared, and the second ceramic green sheets 103 are layered such that the through holes 103*a* formed in the second ceramic green sheets 103 are shifted (respective through holes 103*a* are displaced) from each other. After the second ceramic green sheets 103 are layered, a hollow 104 constituted by the through holes 103*a* is filled with conductive via paste 105. The via paste 105 contains a metal such as Ni, W, Mo, Pt, or the like. The components of the via paste 105 may be the same as the components of the first paste 102 and may differ from the components of the first paste 102. For example, screen printing is usable to fill the hollow 104 with the via paste 105.

FIG. 5(*c*) will be referred. FIG. 5(*c*) is a view in which second paste is printed on the upper surface of the second ceramic green sheet, and, after the second ceramic green sheet 103 is layered again, a third ceramic green sheet 107 is layered. Second paste 106 contains a metal such as Ni, W, Mo, Pt, or the like. The components of the second paste 106 may be the same as the components of the first paste 102 and/or the components of the via paste 105 and may differ therefrom. The third ceramic green sheet 107 does not have the through hole 103*a*. The first paste 102, the second paste 106, and the via paste 105 are in a state of being interposed between the first ceramic green sheet 101 and the third ceramic green sheet 107. Consequently, a ceramic multilayer body 100 is obtained.

FIG. 5(*d*) will be referred in addition. The ceramic multilayer body 100 illustrated in FIG. 5(*c*) is fired, and the ceramic multilayer body 100 is thereby sintered. Consequently, the base 40 including the via conductor 50 and the conductor layer 21 in the inside thereof can be obtained. In other words, the base 40 (the via conductor 50 and the conductor layer 21) can be manufactured. The cavity 50*b* may be formed by, for example, generating a gap between the via paste 105 and the inner surface of the through hole 103*a* in a stage before sintering. Such a gap may be realized by adjusting the filling amount of the via paste 105, the pressure for filling, and the like. A difference in the amount of contraction between the via paste 105 and the second ceramic green sheet 103 in firing may be used for the formation of the cavity 50*b*.

FIG. 3 and FIG. 4 will be referred. The via conductor 50 includes the first part 51 whose length in the first direction Li is larger than the thickness of the first conductor layer 21*a* in a section that includes the via conductor 50 and that extends in the first direction Li perpendicular to the first surface 41, and the second part 52 whose length in the first direction Li is larger than the thickness of the first conductor layer 21*a*, the second part 52 being continuous with the first part 51 and having an outer edge including at least a portion that is displaced from the outer edge of the first part 51 when viewed in the first direction Li. Due to the outer edge of the first part 51 and the outer edge of the second part 52 being displaced from each other, the surface area of the via conductor 50 is increased. Consequently, the contact area of the base 40 with respect to the via conductor 50 is increased. As a result, when heat has been transmitted from the first conductor layer 21*a* to the via conductor 50, the heat is easily transmitted from the via conductor 50 to the base 40. Therefore, the temperatures of the via conductor 50 and the base 40 change in a more balanced state, and a load applied to the first conductor layer 21*a* due to expansion of the via conductor 50 is thus reduced. As a result, it is possible to provide a durable base structure.

The first part 51 is coupled to the first conductor layer 21*a*, the second part 52 is coupled to the first part 51 on a side opposite the first conductor layer 21*a*, and the diameter of the first part 51 is larger than the diameter of the second part 52. Due to the diameter of the first part 51 being larger than the diameter of the second part 52, it is possible to increase the contact area of the via conductor 50 with respect to the first conductor layer 21*a*. In addition, due to the diameter of the second part 52 being smaller than the diameter of the first part 51, a surface of the via conductor 50 on the side of the first conductor layer 21*a* is suppressed from being depressed due to contraction. Specifically, even when the contraction rate of the base 40 and the contraction rate of the via conductor 50 due to a change in temperature differ from each other, it is possible to suppress a situation caused by the contraction thereof and in which the surface of the via conductor 50 on the side of the first conductor layer 21*a* is depressed.

The via conductor 50 includes the third part 53 that faces the first part 51 and that is coupled to the first conductor layer 21*a* with the first conductor layer 21*a* interposed between the third part 53 and the first part 51. Consequently, it is possible to further increase the contact area of the via conductor 50 with respect to the first conductor layer 21*a*. In addition, it is possible to reduce a difference in the contraction stress of the via conductor 50 applied to the upper and lower surfaces of the first conductor layer 21a. It is thus possible to provide the base structure 20 having increased durability.

The cavity 50b is present between the base 40 and the via conductor 50, and the size of the cavity 50b is smaller than the amount of displacement between the outer edge of the first part 51 and the outer edge of the second part 52 in the direction parallel to the first surface 41. Due to the presence of the cavity between the base 40 and the via conductor 50, it is possible to mitigate the stress due to the thermal expansion of the base 40 and the via conductor 50. In addition, due to the cavity 50b having a size larger than the amount of displacement between the outer edge of the first part 51 and the outer edge of the second part 52, the via conductor 50 is close to the base 40. It can be said that the base structure 20 is in a state in which the heat of the via conductor 50 is easily transmitted to the base 40. It is thus possible to further reduce the load applied to the first conductor layer 21a. As a result, it is possible to provide the base structure 20 having increased durability.

FIG. 1 will be referred. The wafer placing device 10 includes the base structure 20, the power supply unit 11 capable of supplying electric power to the first conductor layer 21a, and the control unit 13 that controls power supply of the power supply unit 11. Consequently, it is possible to provide the wafer placing device 10 having durability.

Second Embodiment

Figure 6:
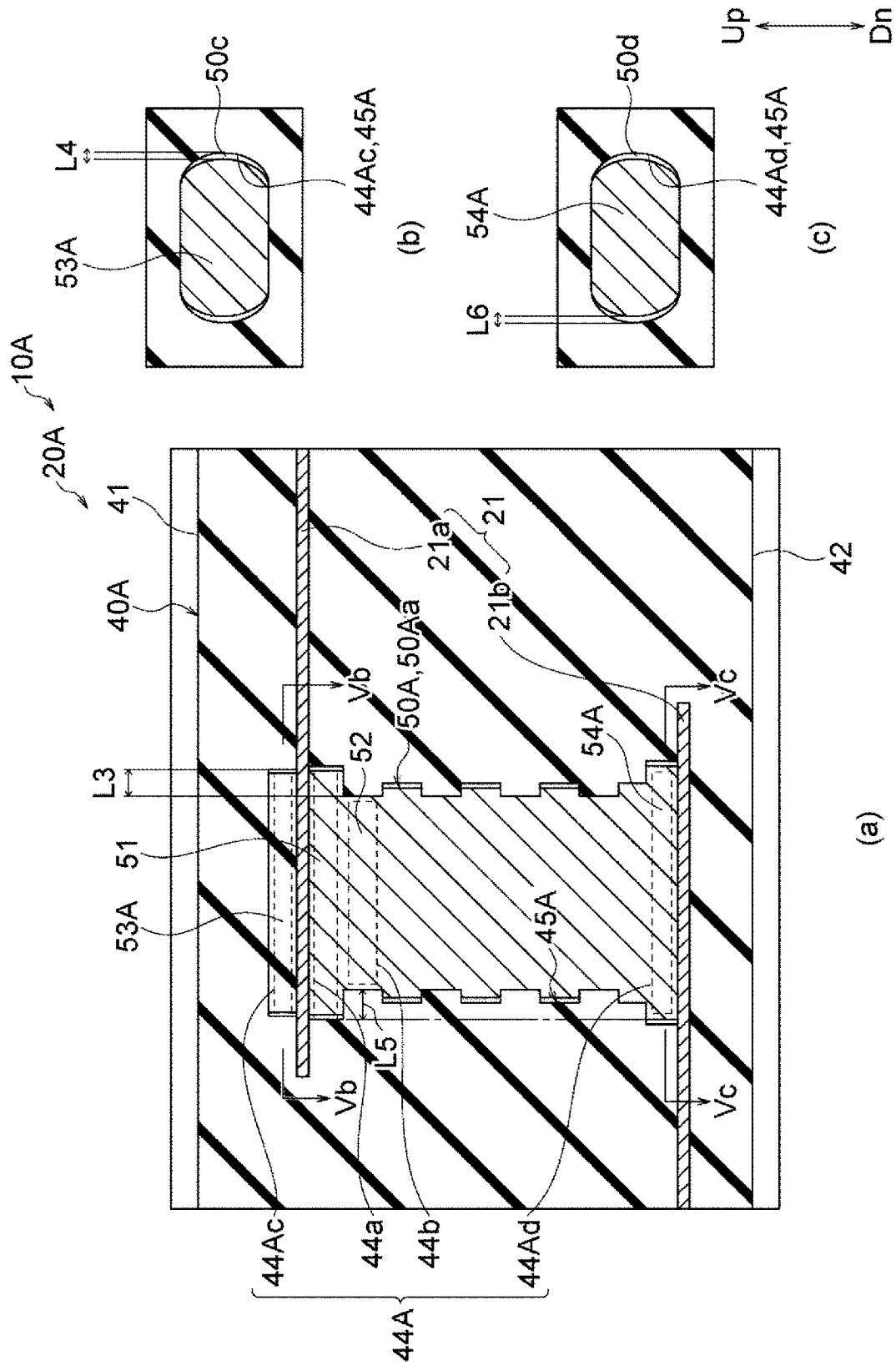
FIG. 6(a), FIG. 6(b), and FIG. 6(c) are sectional views of the periphery of a via conductor of a base structure according to a second embodiment.

FIG. 6(a) will be referred. FIG. 6(a) is a view illustrating a second embodiment according to the present disclosure. FIG. 6(a) corresponds to FIG. 3 mentioned above. In relation to the first embodiment, the base structure 20A according to the second embodiment is different in the shapes of a via hole 44A and a via conductor 50A. The other specific structures are the same as those of the base structure 20 according to the first embodiment. The same signs are used for the same parts as those in the first embodiment, and detailed description of the parts is omitted.

(Via Hole)

The via hole 44A has a third region 44Ac facing the first region 44a with the first conductor layer 21a interposed between the third region 44Ac and the first region 44a, and a fourth region 44Ad positioned on the side of the second conductor layer 21b from the second region 44b.

At least a portion of the inner wall of the via hole 44A in the third region 44Ac is displaced from the inner wall of the via hole 44A in the second region 44b when viewed in the first direction Li. The "displaced" means that the inner wall of the via hole 44A in the third region 44Ac and the inner wall of the via hole 44A in the second region 44b do not coincide with each other in the direction along the first surface 41. Specific contents are omitted since the specific contents can be considered in the same manner as that described in the first embodiment.

The inner diameter of the via hole 44A in the third region 44Ac is larger than the inner diameter of the via hole 44A in the second region 44b. It can be said that the third region 44Ac is larger than the second region 44b in the direction parallel to the first surface 41. The size of the third region 44Ac relative to the second region 44b can be any size. For example, the size of the third region 44Ac in the radial direction of the via hole 44A may be more than or equal to 1.1 times, more than or equal to 1.3 times, more than or equal to 1.5 times, or more than or equal to 1.7 times the size of the second region 44b. The size of the third region 44Ac may be less than 1.1 times the size of the second region 44b. The thickness (the thickness in the first direction Li) of each of the third region 44Ac and the second region 44b is thicker than the thickness of each of the first conductor layer 21a and the second conductor layer 21b.

At least a portion of the inner wall of the via hole 44A in the fourth region 44Ad is displaced from the inner wall of the via hole 44A in the second region 44b when viewed in the first direction Li. The inner diameter of the via hole 44A in the fourth region 44Ad is larger than the inner diameter of the via hole 44A in the second region 44b. It can be said that the fourth region 44Ad is larger than the second region 44b in the direction parallel to the first surface 41. The size of the fourth region 44Ad relative to the second region 44b can be any size. For example, the size of the fourth region 44Ad in the radial direction of the via hole 44A may be more than or equal to 1.1 times, more than or equal to 1.3 times, more than or equal to 1.5 times, or more than or equal to 1.7 times the size of the second region 44b. The size of the fourth region 44Ad may be less than 1.1 times the size of the second region 44b. The thickness of each of the fourth region 44Ad and the second region 44b is thicker than the thickness of each of the first conductor layer 21a and the second conductor layer 21b.

As illustrated in the drawings, a plurality of regions constituted by recesses and protrusions 45A of the via hole 44A may be present between the second region 44b and the fourth region 44Ad. In a direction along the first direction Li, the length (height) of each of the plurality of regions is larger than the thickness of each of the first conductor layer 21a and the second conductor layer 21b. The inner diameter of the via hole 44A in the plurality of regions is smaller than the inner diameter of the via hole 44A in the third region 44Ac and the fourth region 44Ad.

(Via Conductor)

The via conductor 50A includes a third part 53A positioned in the third region 44Ac and a fourth part 54A positioned in the fourth region 44Ad.

The length of the third part 53A in the first direction Li is larger than the thickness of each of the first conductor layer 21a and the second conductor layer 21b. At least a portion of the outer edge of the third part 53A is displaced from the outer edge of the second part 52 when viewed in the first direction Li. The "displaced" can be considered in the same manner as that described in the first embodiment, and description of "displaced" is thus omitted. The diameter of the third part 53A is larger than the diameter of the second part 52. A cavity 50c is present between the third part 53A and a base 40A.

The fourth part 54A is positioned on the side of the second conductor layer 21b from the second part 52 and is coupled to the upper surface of the second conductor layer 21b. At least a portion of the outer edge of the fourth part 54A is displaced from the outer edge of the second part 52 when viewed in the first direction Li. The diameter of the fourth part 54A is larger than the diameter of the second part 52. The material of the fourth part 54A (the via conductor 50) may be the same as the material of the second conductor layer 21b and, in this case, may be integral with the second conductor layer 21b.

FIG. 6(b) will be referred in addition. The cavity 50c is present between the third part 53A and the base 40A (the inner wall of the via hole 44A). The size of the cavity 50c is smaller than the amount of displacement between the outer edge of the third part 53A and the outer edge of the second part 52 in the direction parallel to the first surface 41. When the amount of displacement between the outer edge of the third part 53A and the outer edge of the second part 52 is represented by L3 and the size of the cavity 50c is represented by L4, L3>L4 is established. The cavity 50c is smaller than the amount of displacement between the outer edge of the first part 51 and the outer edge of the second part 52 described in Embodiment 1. In other words, L1 (refer to FIG. 3)>L4 is established. FIG. 6(c) will be referred in addition. A cavity 50d is present between the fourth part 54A and the base 40A. The size of the cavity 50d is larger than the amount of displacement between the outer edge of the fourth part 54A and the outer edge of the second part 52 in the direction parallel to the first surface 41. When the amount of displacement between the outer edge of the fourth part 54A and the outer edge of the second part 52 is represented by L5 and the size of the cavity 50d is represented by L6, L5>L6 is established. The size of the cavity 50d also satisfies L1>L6 in relation between the outer edge of the first part 51 and the outer edge of the second part 52. In other words, as already described in the first embodiment, it can be said that the size of the cavity 50d is smaller than the amount of displacement between the outer edge of the first part 51 and the outer edge of the second part 52 in the direction parallel to the first surface 41.

The via conductor 50A includes a plurality of recesses and protrusions 50Aa between the second part 52 and the fourth part 54A. The diameter of each part of these recesses and protrusions 50Aa is smaller than the diameter of each of the third part 53A and the fourth part 54A. The sizes of the diameter of the third part 53A and the diameter of the fourth part 54A can be any sizes. The diameter of the third part 53A may be larger than the diameter of the fourth part 54A, and the diameter of the fourth part 54A may be larger than the diameter of the third part 53A. The diameter of the third part 53A and/or the fourth part 54A may be larger than the diameter of the first part 51.

At least a portion of the outer edge of the third part 53A is displaced from the outer edge of the first part 51 when viewed in the first direction Li. Consequently, the contact area of the via conductor 50A with respect to the base 40A is further increased. As a result, it is possible to further reduce the load applied to the first conductor layer 21a due to the expansion of the via conductor 50A. Consequently, it is possible to provide the base structure 20A having increased durability.

The diameter of the third part 53A is larger than the diameter of the second part 52. Consequently, it is possible to increase the contact area of the via conductor 50A with respect to the first conductor layer 21a.

The diameter of the fourth part 54A is larger than the diameter of the second part 52. Consequently, it is possible to increase the contact area of the via conductor 50A with respect to the second conductor layer 21b.

Third Embodiment

Figure 7:
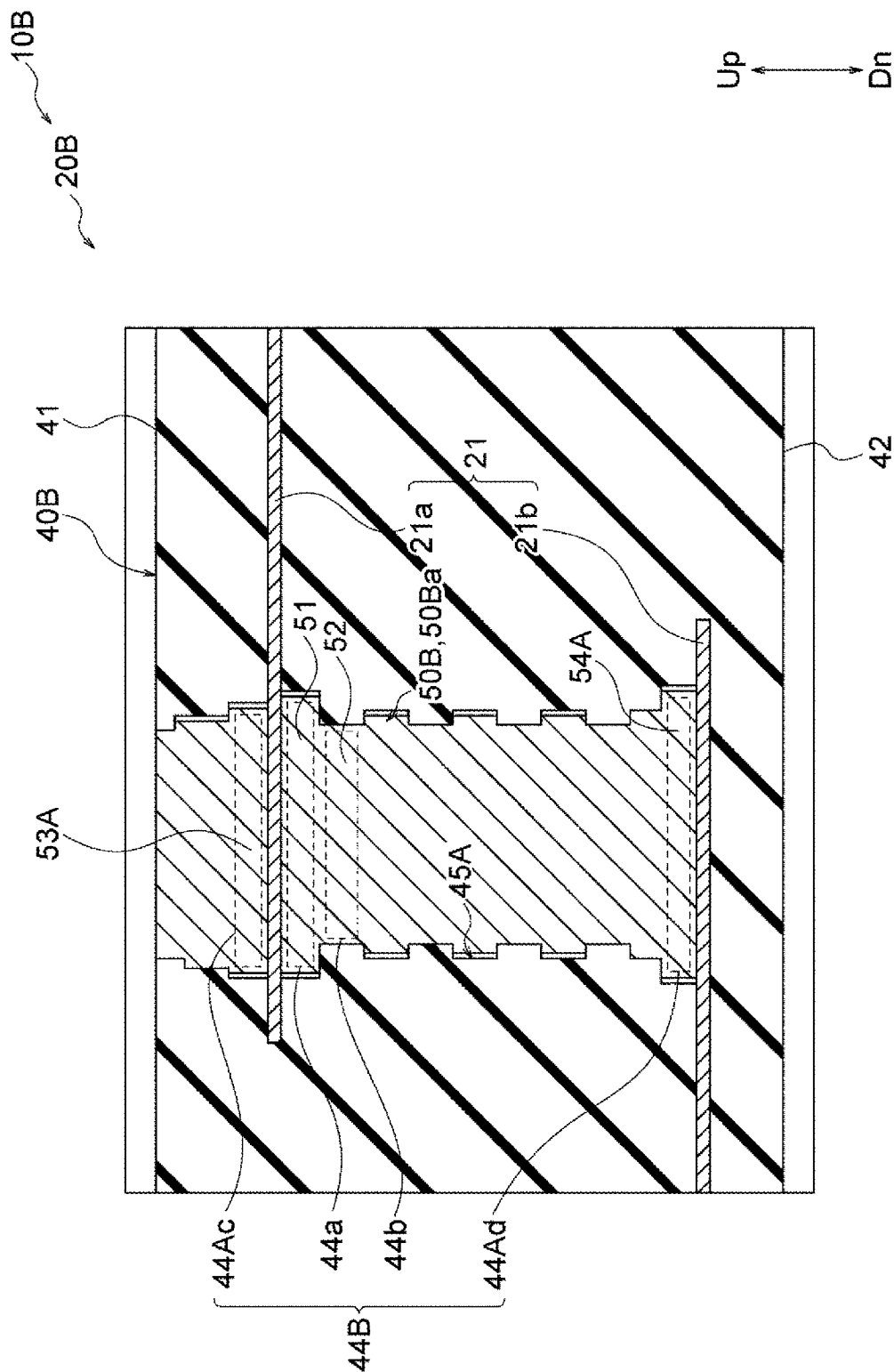
FIG. 7 is a sectional view of the periphery of a via conductor of a base structure according to a third embodiment.

FIG. 7 will be referred. FIG. 7 is a view illustrating a third embodiment according to the present disclosure. FIG. 7 corresponds to FIG. 6(a) mentioned above. The same signs are used for the same parts as those of the second embodiment, and detailed description of the parts is omitted.

(Via Hole)

A via hole 44B has a plurality of regions constituted by the recesses and protrusions 45A of the via hole 44B between the third region 44Ac and the first surface 41. The length of each of these regions in the first direction Li is larger than the thickness of each of the first conductor layer 21a and the second conductor layer 21b. Each of the aforementioned regions is smaller than the first part 51, the third part 53A, and the fourth part 54A in the length in the direction parallel to the first surface 41. The via hole 44B opens in the upper surface of the base 40B.

(Via Conductor)

A via conductor 50B includes a plurality of recesses and protrusions 50Ba between the third part 53A and the first surface 41. The diameter of each part of these recesses and protrusions 50Ba is smaller than the diameter of each of the first part 51, the third part 53A, and the fourth part 54A. The length of each of the recesses and protrusions 50Ba in the first direction Li is larger than the thickness of each of the first conductor layer 21a and the second conductor layer 21b.

Fourth Embodiment

Figure 8:
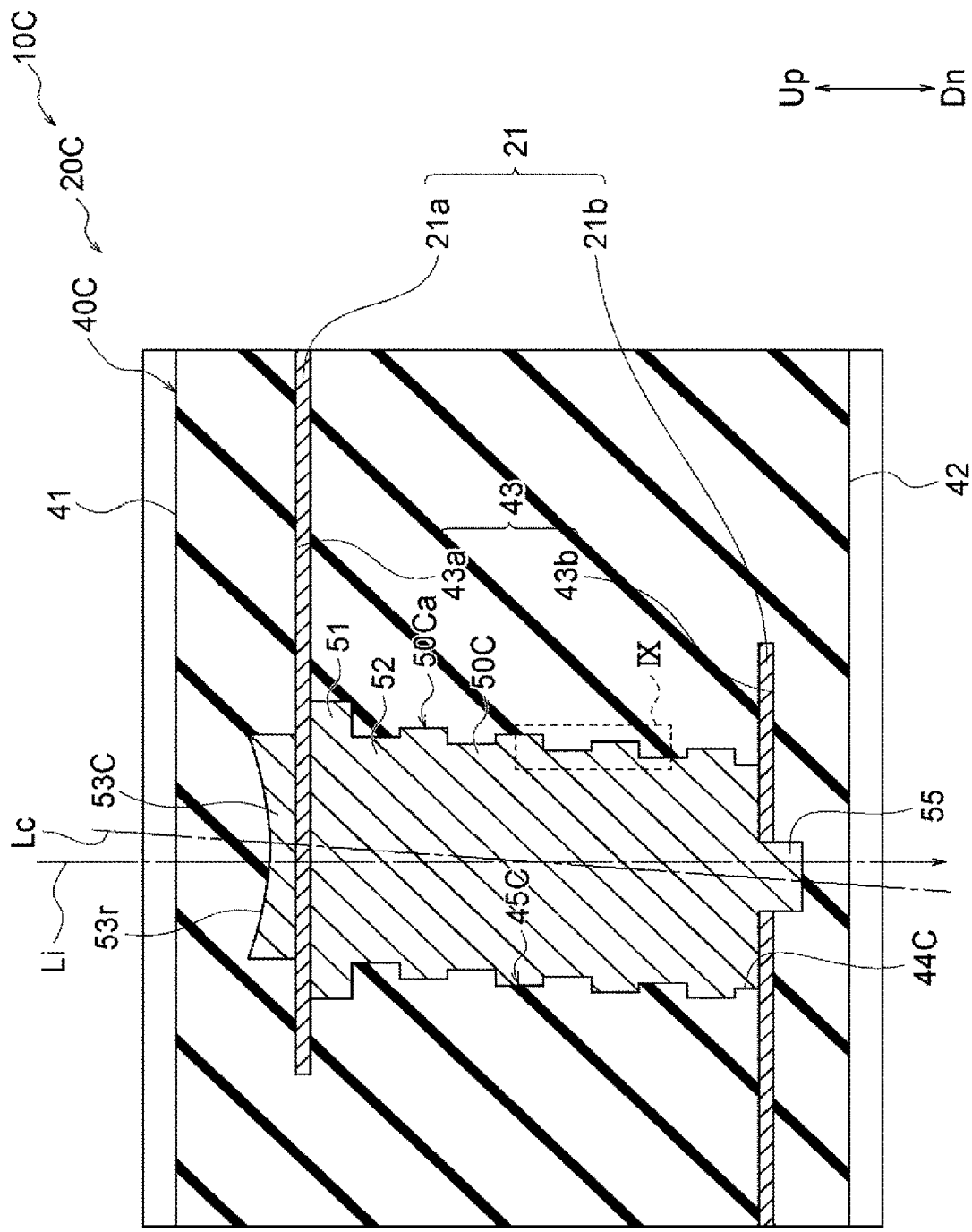
FIG. 8 is a sectional view of the periphery of a via conductor of a base structure according to a fourth embodiment.
Figure 9:
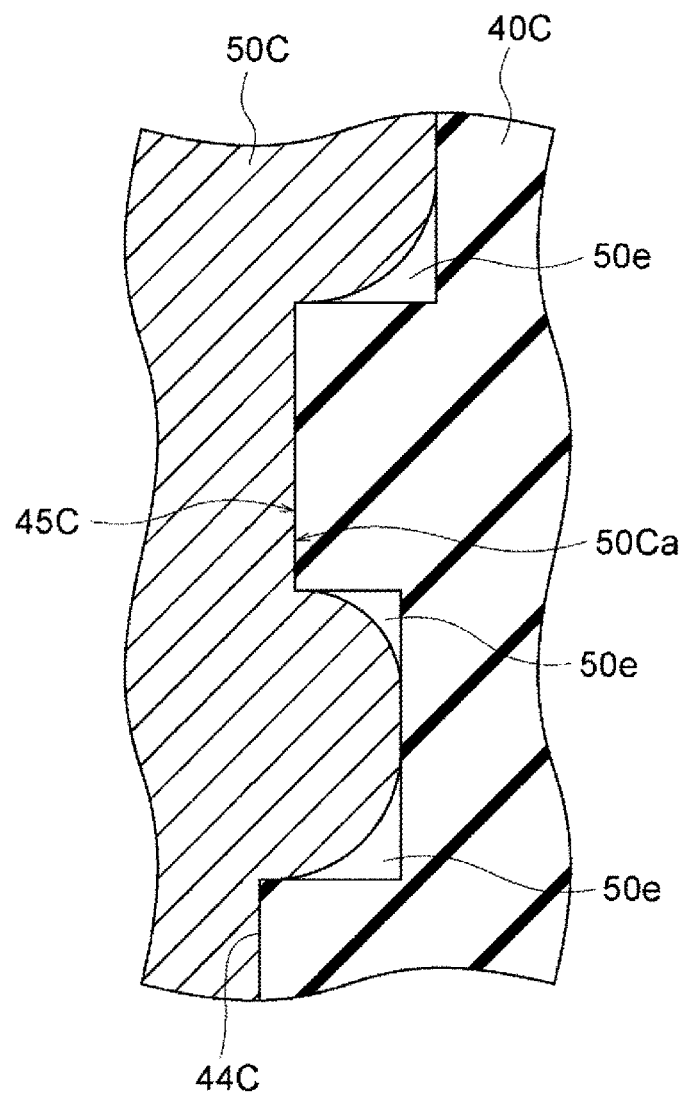
FIG. 9 is an enlarged view of the part IX in FIG. 8.

FIG. 8 and FIG. 9 will be referred. FIG. 8 is a view illustrating a fourth embodiment according to the present disclosure. FIG. 8 corresponds to FIG. 3 of the first embodiment. FIG. 9 is an enlarged view of the region IX in FIG. 8. The same signs are used for the same parts as those in the first embodiment, and detailed description of the parts is omitted.

In short, the present embodiment differs from the first embodiment in terms of a via conductor 50C being inclined with respect to the first direction Li, a third part 53C including a recessed portion 53r on the upper surface thereof, a cavity 50e being relatively small, and the via conductor 50C passing (including a protruding portion 55) through the second conductor layer 21b. Any one or more of these four differences may be combined with the first embodiment selectively. Although the first embodiment is used as a reference, one or more of the aforementioned four differences may be combined with the second and third embodiments as long as contradiction and the like are not generated. The aforementioned differences will be described below specifically.

A center line Lc of the via conductor 50C will be considered in a section, such as that illustrated in FIG. 8, parallel to the first direction Li and substantially passing through the centroid of the volume of the via conductor 50C. The center line Lc is inclined with respect to the first direction Li. As already described, the first direction Li is a direction perpendicular to the first surface 41. It can be said that the via conductor 50C is inclined with respect to the first direction Li.

The center line Lc may be reasonably obtained. For example, in each position in the first direction Li, a center position that divides the diameter (the length in the left-right direction in FIG. 8, the length orthogonal to the first direction Li) of the via conductor 50C into two equal parts is obtained. A line formed by connecting the center positions may be considered as the center line Lc. When, as in the illustrated example, the diameter is different for each certain thickness of the via conductor 50C, positions of the center in the radial direction and the center in the thickness direction in each part (for example, the first part 51, the second part 52, and the like) of recesses and protrusions 50Ca are obtained, and a combination (a straight line or a bent line as a whole) of straight lines that connect the positions to each other may be considered as the center line Lc. When the center line Lc is to be obtained, a special part such as the protruding portion 55 may be ignored.

In the illustrated example, the center line Lc has a substantially linear shape as a whole. From another point of view, in the entirety of the center line Lc, directions of the center line Lc from the lower side toward the upper side are inclined toward the same side with respect to the first direction Li. The center line Lc may be bent midway. A direction from the lower side toward the upper side in a portion of the center line Lc and a direction from the lower side toward the upper side in another portion of the center line Lc may be inclined toward mutually opposite sides with respect to the first direction Li. The center line Lc may include a part inclined with respect to the first direction Li and a part parallel to the first direction Li. An inclination angle of the center line Lc with respect to the first direction Li may be set, as appropriate. One example of the inclination angle is more than or equal to 3° and less than or equal to 10°.

The via conductor 50C that is inclined with respect to the first direction Li as described above may be produced by an appropriate method. For example, in the manufacturing method described with reference to FIG. 5(a) to FIG. 5(d), the positions of the plurality of through holes 103a of the plurality of ceramic green sheets 103 may be displaced from each other to thereby realize the via conductor 50C.

As described above, in the present embodiment, at least a portion of the center line Lc of the via conductor 50C is inclined with respect to the first direction Li in a section that includes the via conductor 50C and that extends in the first direction Li perpendicular to the first surface 41.

In this case, for example, a stress applied to a base 40C by the thermal expansion and thermal contraction of the via conductor 50C in the first direction Li is mitigated. As a result, for example, the durability of a base structure 20C is improved.

The shape and the dimensions of the recessed portion 53r of the third part 53C may be set, as appropriate. For example, in a section, such as that in FIG. 8, parallel to the first direction Li, the recessed portion 53r may be constituted by a curved line, or a portion or the entirety of the recessed portion 53r may be constituted by a straight line. The recessed portion 53r may substantially extend over the entirety (for example, a length of more than or equal to 80% of the diameter of the third part 53C) of the upper surface of the third part 53C (the illustrated example) and may be smaller than this. The depth of the recessed portion 53r at a deepest position may be, for example, more than or equal to 5%, more than or equal to 10%, more than or equal to 20%, or less than 5% of the thickness of the third part 53C.

The base 40C is positioned at the recessed portion 53r. In other words, the base 40C includes a protruding portion sinking into the upper surface (the upper surface of the third part 53C) of the via conductor 50C. As with the cavity 50b, the recessed portion 53r may be a vacuum and may enclose an appropriate gas, differently from the illustrated example.

The recessed portion 53r may be formed by an appropriate method. For example, in the manufacturing method described with reference to FIG. 5(a) to FIG. 5(d), a recessed portion is formed on the upper surface of the via paste 105 that serves as the third part 53C. Thereafter, the third ceramic green sheet 107 that overlaps the via paste 105 is overlaid. The recessed portion 53r may be formed in this manner.

As described above, in the present embodiment, the surface of the third part 53C on the side opposite the first conductor layer 21a is recessed (the recessed portion 53r is provided).

In this case, the base 40C is restrained by the via conductor 50C, for example, due to a portion of the base 40C entering the recessed portion 53r. As a result, for example, probability of a crack being generated in the base 40C is reduced. When a portion of the base 40C is not positioned in the recessed portion 53r (when the recessed portion 53r is a cavity), for example, transmission of heat from the via conductor 50C to the base 40C is mitigated, and probability of a singular point of temperature being generated at the position of the via conductor 50C is reduced.

The cavities 50b, 50c, and 50d described in the first to third embodiments each have a size extending over the entirety of the side surface of each part (for example, the first part 51, the third part 53A, and the fourth part 54A) constituting the recesses and protrusions, in a section, such as that in FIG. 8, parallel to the first direction Li. As illustrated in FIG. 9, some or all of these cavities may be the cavities 50e positioned at only a portion of the side surfaces of the parts.

In the illustrated example, the cavities 50e are positioned at, in the parts constituting the recesses and protrusions 50Ca of the via conductor 50C, corner portions (on upper and lower both sides) of the side surface of a part constituting a protrusion. From another point of view, the cavities 50e are positioned at, in the parts constituting recesses and protrusions 45C of a via hole 44C, corner portions of the side surface of a part constituting a recess. Differently from the illustrated example, each cavity 50e smaller than the thickness of each of the parts constituting the recesses and protrusions 50Ca may be positioned at the side surface of a part constituting a recess of the recesses and protrusions 50Ca, may be positioned only at one of the corner portions on the upper and lower both sides of each part, and may be positioned at the center in the up-down direction of the side surface of each part.

The shape and the dimensions of each cavity 50e may be set, as appropriate. In the illustrated example, the protrusion of the side surface of the via conductor 50C has a round shape, and each cavity 50e has a shape corresponding to the round shape. The size of each cavity 50e in the up-down direction may be less than 50% of the length of each part of the recesses and protrusions 50Ca in the up-down direction and may be more than or equal to 50% of the length of each part of the recesses and protrusions 50Ca in the up-down direction. The size of each cavity 50e in the circumferential direction of the via conductor 50C may be the same as the sizes of the cavities in the other embodiments and may be smaller than this.

Each cavity 50e having a comparatively small size according to the present embodiment may be formed by an appropriate method. For example, in the manufacturing method described with reference to FIG. 5(a) to FIG. 5(d), the pressure and the like for disposing the via paste 105 may be adjusted so that, while a recess on the inner peripheral surface of the via hole 44C is filled with the via paste 105, the recess is not completely filled with the via paste 105. As with the other cavities, a difference in the amount of contraction between the via paste 105 and the second ceramic green sheet 103 in firing may be used for the formation of each cavity 50e.

The cavities 50e exert the same effect as the effect of the cavities in the other embodiments. For example, since the cavities 50e can be positioned at only the corner portions of recesses and protrusions where stress concentration easily occurs, it is possible to effectively mitigate the stress applied to the base 40C while ensuring the volume of the via conductor 50, compared with the cavities in the other embodiments.

The protruding portion 55 protrudes downward from, of the via conductor 50C, a part upper than the second conductor layer 21b and passes through the second conductor layer 21b. Further, the protruding portion 55 passes through, of the base 40C, a portion of a part lower than the second conductor layer 21b. Differently from the illustrated example, the protruding portion 55 may pass through only the second conductor layer 21b (may not pass through the base 40C) and may pass through, of the base 40C, the entirety of a part lower than the second conductor layer 21b.

The shape, the dimensions, and the like of the protruding portion 55 may be set, as appropriate. For example, when viewed in the first direction Li, the shape of the protruding portion 55 may be a circular shape, may be a polygonal shape, may be the same shape as the shapes of the other parts of the via conductor 50C, and may differ therefrom. The protruding portion 55 may have a columnar shape parallel to the first direction Li, may have a columnar shape inclined with respect to the first direction Li, and may have a configuration that includes recesses and protrusions on the side surface thereof similarly to the part upper than the second conductor layer 21b of the via conductor 50C.

The protruding portion 55 is, of the via conductor 50C, a part that protrudes from a part upper than the second conductor layer 21b. Therefore, the diameter of the protruding portion 55 is smaller than the diameter of a part (by following the second embodiment, hereinafter referred to as the fourth part) of the via conductor 50C connected to the upper surface of the second conductor layer 21b. A difference in the diameters may be set, as appropriate. For example, the diameter of the protruding portion 55 may be less than 9/10, less than 1/2, or less than 1/5 of the diameter of the fourth part. The position of the center or any position of the protruding portion 55 may overlap the center of the fourth part and may not overlap the center of the fourth part.

Differently from the illustrated example, the diameter of the protruding portion 55 may be equal to the diameter of the fourth part. In other words, the via conductor 50C may pass through the second conductor layer 21b while having a shape in which it is difficult to regard that the protruding portion 55 is formed.

The protruding portion 55 may be formed by an appropriate method. For example, in the manufacturing method described with reference to FIG. 5(a) to FIG. 5(d), a part of the base 40C lower than the second conductor layer 21b is formed by a plurality of ceramic green sheets. Then, before the application of the first paste 102, a through hole (a through hole that serves as a lower end portion of the via hole 44C) for disposing the protruding portion 55 therein is formed in the ceramic green sheet for which the first paste 102 serving as the second conductor layer 21b is printed on the upper surface thereof.

Thereafter, as illustrated in FIG. 5(a) and FIG. 5(b), the first paste 102 is applied to the ceramic green sheet in which the aforementioned through hole is formed, the second ceramic green sheet 103 is layered thereon, and the hollow 104 is filled with the via paste 105. At this time, a portion of the via paste 105 also flows into a through hole of the ceramic green sheet directly under the first paste 102. The part that has flowed into the through hole is a part that serves as the protruding portion 55.

Thereafter, the ceramic green sheet that constitutes the second surface 42 of the base 40C is layered on the lower surface of the ceramic green sheet directly under the first paste 102. When the paste that serves as the protruding portion 55 flows out downward from the lower surface of the ceramic green sheet directly under the first paste 102, the flowed-out part may be, for example, wiped away before the ceramic green sheet that constitutes the second surface 42 is layered. Before or after the ceramic green sheet that constitutes the second surface 42 is layered, the ceramic green sheet 107 that constitutes the first surface 41 is also layered as illustrated in FIG. 5(c). Thereafter, sintering is performed as illustrated in FIG. 5(d).

Differently from the above, the ceramic green sheet that constitutes the second surface 42 may be layered before the through hole of the ceramic green sheet to which the first paste 102 serving as the second conductor layer 21b is applied is filled with the paste serving as the protruding portion 55, and the through hole may be filled with the paste serving as the protruding portion 55 before the application of the first paste 102.

As described above, in the present embodiment, the via conductor 50C passes through the second conductor layer 21b.

In this case, for example, the second conductor layer 21b is expected to exert the same effect as the effect of the third part 53 contributing the connection with the first conductor layer 21a. For example, a difference in the contraction stress of the via conductor 50C between the upper side and the lower side of the second conductor layer 21b can be reduced. In addition, for example, in a form in which the lower surface of the fourth part (the part connected to the upper surface of the second conductor layer 21b) is connected to the upper surface of the second conductor layer 21b, probability of the lower surface of the fourth part being recessed due to a difference in the contraction rate between the base 40C and the via conductor 50C is reduced, which improves reliability of connection. When, as described above, the protruding portion 55 is formed by causing, before layering the ceramic green sheet constituting the second surface 42, the via paste 105 with which the hollow 104 is filled to flow into the through hole of the ceramic green sheet under the second conductor layer 21b, it is possible to visually confirm that the via paste 105 reaches the position of the second conductor layer 21b.

The technique according to the present disclosure is not limited to the above embodiments and may be carried out in various forms.

In the first embodiment, a form in which the base is joined to the shaft member by an adhesive material or solid phase bonding has been described. However, when the base and the shaft member are both ceramic, the base and the shaft member may be integrated with each other by firing.

Furthermore, in the first embodiment, an example in which the first conductor layer and the second conductor layer include the resistive heating elements has been described. However, each of the first conductor layer and the second conductor layer may include, other than the resistive heating elements, an electrostatic chuck that attracts a wafer to the first surface and may include a high-frequency electrode that is used to generate plasma. A resistive heating element may be included in only one conductor layer constituted by two layers. When a resistive heating element is included in only one conductor layer constituted by two layers, the other conductor layer (the first conductor layer or the second conductor layer) may include an electrostatic chuck, may contain a high-frequency electrode, and may be a simple wiring layer through which current flows. The conductor layer may be constituted by only the first conductor layer.

In the first embodiment, an example in which the base structure has a cavity between the base and the via conductor has been described. However, the base structure may not have a cavity between the base and the via conductor.

Furthermore, the via conductor may not have a plurality of recesses and protrusions between the second part and the second conductor layer.

In the first embodiment, the base structure in which the terminal is disposed at the lower surface of the base has been described. However, the terminal may be disposed at the upper surface of the base, the side surface of the base, or the like. The location where the terminal is disposed can be any location.

Furthermore, in the first embodiment, the base structure in which the first surface on which a wafer is to be placed is parallel to the second surface has been described. However, the first surface is not necessarily parallel to the second surface. The second surface may have hollows (recesses and protrusions) at some locations. For example, a part of the terminal positioned outside the base may be surround by the hollows.

An object other than a wafer can be placed on the base structure according to the present disclosure. Furthermore, a wafer to be placed on the base structure according to the present disclosure is not limited to a semiconductor and includes, for example, a crystal wafer.

REFERENCE SIGNS LIST 10, 10A, 10B, 10C wafer placing device
11 power supply unit
13 control unit
20, 20A, 20B, 20C base structure
21a first conductor layer
21b second conductor layer
40, 40A, 40B, 40C base
50, 50A, 50B, 50C via conductor
50b cavity
51 first part
52 second part
53, 53A, 53C third part
54A fourth part
Li first direction

The invention claimed is:

1. A base structure comprising:
a base, a first conductor layer, and a via conductor,
the base having a first surface and a second surface positioned opposite to the first surface,
the first conductor layer being positioned along the first surface in the base,
the via conductor intersecting and being coupled to the first conductor layer in the base,
the via conductor including,
in a section that includes the via conductor and that extends in a first direction perpendicular to the first surface,
a first part whose length in the first direction is larger than a thickness of the first conductor layer,
a second part whose length in the first direction is larger than the thickness of the first conductor layer, the second part being continuous with the first part and having an outer edge including at least a portion that is displaced from an outer edge of the first part when viewed in the first direction, and
a third part facing the first part and coupled to the first conductor layer with the first conductor layer interposed between the third part and the first part.

2. The base structure according to claim 1,
wherein the first part is coupled to the first conductor layer,
the second part is coupled to the first part on a side opposite the first conductor layer, and
a diameter of the first part is larger than a diameter of the second part.

3. The base structure according to claim 1,
wherein at least a portion of an outer edge of the third part is displaced from the outer edge of the first part when viewed in the first direction.

4. The base structure according to claim 1,
wherein a diameter of the third part is larger than a diameter of the second part.

5. The base structure according to claim 1,
wherein a surface of the third part on a side opposite the first conductor layer is recessed.

6. The base structure according to claim 1, further comprising:
a second conductor layer facing the first conductor layer with the first part and the second part interposed between the second conductor layer and the first conductor layer,
wherein the via conductor includes a fourth part that is positioned on a side of the second conductor layer from the second part and that is coupled to the second conductor layer, and
a diameter of the fourth part is larger than a diameter of the second part.

7. The base structure according to claim 1, further comprising:
a second conductor layer facing the first conductor layer with the first part and the second part interposed between the second conductor layer and the first conductor layer,
wherein the via conductor passes through the second conductor layer.

8. The base structure according to claim 1,
wherein at least a portion of a center line of the via conductor is inclined with respect to the first direction in the section.

9. The base structure according to claim 1,
wherein a cavity is present between the base and the via conductor, and
the cavity has a size that is smaller than an amount of displacement between an outer edge of the first part and an outer edge of the second part in a direction parallel to the first surface.

10. The base structure according to claim 1,
wherein the base structure is a heater in which the first conductor layer includes a resistive heating element.

11. A wafer placing device comprising:
the base structure according to claim 1;
a power supply unit that is capable of supplying electric power to the first conductor layer; and
a control unit that controls power supply of the power supply unit.

* * * * *